United States Patent
Hu et al.

(10) Patent No.: US 12,044,583 B2
(45) Date of Patent: Jul. 23, 2024

(54) DIGITAL TEMPERATURE SENSOR CIRCUIT

(71) Applicant: NO.24 RESEARCH INSTITUTE OF CHINA ELECTRONICS TECHNOLOGY GROUP CORPORATION, Chongqing (CN)

(72) Inventors: Rongbin Hu, Chongqing (CN); Jian'an Wang, Chongqing (CN); Dongbing Fu, Chongqing (CN); Guangbing Chen, Chongqing (CN); Zhengping Zhang, Chongqing (CN); Hequan Jiang, Chongqing (CN); Gangyi Hu, Chongqing (CN)

(73) Assignee: NO.24 RESEARCH INSTITUTE OF CHINA ELECTRONICS TECHNOLOGY GROUP CORPORATION, Chongqing (CN)

( * ) Notice: Subject to any disclaimer, the term of this patent is extended or adjusted under 35 U.S.C. 154(b) by 1055 days.

(21) Appl. No.: 16/636,021

(22) PCT Filed: Sep. 11, 2017

(86) PCT No.: PCT/CN2017/101203
§ 371 (c)(1),
(2) Date: Mar. 5, 2021

(87) PCT Pub. No.: WO2019/024176
PCT Pub. Date: Feb. 7, 2019

(65) Prior Publication Data
US 2022/0228928 A1    Jul. 21, 2022

(30) Foreign Application Priority Data
Aug. 3, 2017 (CN) .......................... 201710656711.8

(51) Int. Cl.
*G01K 7/01* (2006.01)
*G01K 15/00* (2006.01)

(52) U.S. Cl.
CPC ............. *G01K 7/01* (2013.01); *G01K 15/005* (2013.01); *G01K 2219/00* (2013.01)

(58) Field of Classification Search
CPC ........................... G01K 7/01; G01K 2219/00
See application file for complete search history.

(56) References Cited

U.S. PATENT DOCUMENTS 7,075,360 B1 * 7/2006 Holloway ............... G05F 3/262
327/543
10,439,635 B1 * 10/2019 Tang ...................... H03M 3/458
(Continued)

FOREIGN PATENT DOCUMENTS

CN    103296904 A        9/2013
CN    108955923 A   *   12/2018
(Continued)

OTHER PUBLICATIONS

饶榕山等. 应用于温度传感器的Sigma_Delta 调制器的设计. 中国集成电路,Jun. 30, 2014 (Jun. 30, 2014), ISSN: 1681-528, 41-46 and 62. (Wei, Rongshan et al. Design of a Sigma-Delta Modulator Applied in the Temperature Sensor. China Integrated Circuit.).

*Primary Examiner* — Mirellys Jagan
(74) *Attorney, Agent, or Firm* — IPRTOP LLC

(57) ABSTRACT

A digital temperature sensor circuit is disclosed. The digital temperature sensor circuit includes a proportional to the absolute temperature (PTAT) current source, generating a PTAT current proportional to absolute temperature; a sigma-delta modulation module, including an integrator, an analog-to-digital conversion unit, and a feedback digital-to-analog conversion unit; the integrator converts the PTAT current into temperature voltage; the analog-to-digital conversion (Continued)

unit compares the temperature voltage with a band gap reference voltage to generate a digital modulation signal with a duty ratio proportional to the temperature; the feedback digital-to-analog conversion unit adjusts the voltage input by the analog-to-digital conversion unit and controls the charging and discharging speed of the integrator; a digital filter, quantizing the digital modulation signal into a digital signal, and outputting the digital signal.

11 Claims, 2 Drawing Sheets

(56) References Cited

U.S. PATENT DOCUMENTS

2007/0126619 A1* 6/2007 McGrath ............... H03M 3/392
341/155
2015/0003490 A1 1/2015 Ash et al.
2019/0316973 A1* 10/2019 Ippolito ................... G01K 7/01

FOREIGN PATENT DOCUMENTS

| CN | 113758606 B | * | 9/2023 | |
| GB | 2541252 A | * | 2/2017 | ............... G01K 7/01 |

* cited by examiner

DIGITAL TEMPERATURE SENSOR CIRCUIT

TECHNICAL FIELD

The disclosure relates to the technical field of integrated circuits, and in particular, relates to a digital temperature sensor circuit.

BACKGROUND

With the development of various kinds of precision instruments, the requirements for detection accuracy has been increased. The temperature monitoring of the entire circuit system has increased the applications of integrated temperature sensors in temperature detection systems and integrated chips which requires for temperature protection. For high-power semiconductor devices, such as CPUs, ultra-high-speed AD converters, ultra-high-speed DA converters, and power amplifiers, the operating temperatures of the chips are required to be detected timely and effectively.

However, in the traditional devices, a temperature sensor is placed on the back of the chip to detect the temperature. The above method cannot accurately detect the internal temperature of the chip, especially for high-power devices. In high-power devices, the internal temperature distribution of the chip is not uniform. The local hot spots make the detected temperature not accurately indicate the temperature of the circuit, the chips cannot be protected effectively.

SUMMARY

The present disclosure provides a digital temperature sensor circuit to solve the problem that the digital temperature sensor circuit is unable to accurately collect the circuit temperature, and the circuit cannot be protected effectively.

The present disclosure provides a digital temperature sensor circuit, including: a proportional to the absolute temperature (PTAT) current source, generating a PTAT current proportional to absolute temperature; a sigma-delta modulation module, including an integrator, an analog-to-digital conversion unit, and a feedback digital-to-analog conversion unit; the integrator converts the PTAT current into temperature voltage; the analog-to-digital conversion unit compares the temperature voltage with a band gap reference voltage to generate a digital modulation signal with a duty ratio proportional to the temperature; the feedback digital-to-analog conversion unit adjusts the voltage input by the analog-to-digital conversion unit and controls the charging and discharging speed of the integrator; a digital filter, quantizing the digital modulation signal into a digital signal, and outputting the digital signal.

In an embodiment of the present disclosure, a positive terminal of the PTAT current source is connected to a power supply voltage, and a negative terminal of the PTAT current source is connected to an input terminal of the analog-to-digital conversion unit.

In an embodiment of the present disclosure, the integrator is an integration capacitor, one terminal of the integration capacitor is respectively connected to an output terminal of the PTAT current source and an input terminal of the analog-to-digital conversion unit, and the other terminal of the integration capacitor is grounded In an embodiment of the present disclosure, the analog-to-digital conversion unit comprises a comparator, a first flip-flop and a second flip-flop, a positive input terminal of the comparator is connected to a band gap reference voltage, a negative input terminal of the comparator is connected to an output terminal of the integrator, an positive output terminal of the comparator is connected to the first flip-flop, the first flip-flop outputs a digital modulation signal, a negative output terminal of the comparator is connected to the second flip-flop, and the output terminal of the second flip-flop is connected to the feedback digital-to-analog conversion unit.

In an embodiment of the present disclosure, the comparator is a dynamic comparator.

In an embodiment of the present disclosure, the feedback digital-to-analog conversion unit comprises a differential pair and a first constant current source, the differential pair is composed of a first NMOS transistor and a second NMOS transistor, a gate of the first NMOS transistor is connected to an output terminal of the second flip-flop, a drain of the first NMOS transistor is connected to an input terminal of the PTAT current source; a gate of the second NMOS transistor is connected to a non-Q output terminal of the first flip-flop, a drain of the second NMOS transistor is connected to the power supply voltage, a source of the differential pair is connected to a positive terminal of the first constant current source, and a negative terminal of the first constant current source is grounded.

In an embodiment of the present disclosure, the first flip-flop and the second flip-flop are both D-type flip-flop.

In an embodiment of the present disclosure, the control terminals of the first flip-flop and the second flip-flop and the input terminal of the digital filter are respectively connected to a clock signal.

In an embodiment of the present disclosure, the digital temperature sensor circuit further includes a current adjustment module, the current adjustment module is respectively connected to a PTAT current source and an integrator for adjusting the current input into the integrator.

In an embodiment of the present disclosure, the current adjustment module is a second constant current source, a positive terminal of the current adjustment module is connected to a PTAT current source, and a negative terminal of the current adjustment module is grounded.

In one embodiment of the disclosure, the digital filter is a digital low-pass filter.

The digital temperature sensor circuit of the present disclosure has the following beneficial effects:

the temperature sensor is integrated with the circuit-under-test in the same chip, the PTAT current is modulated by sigma-delta module using the proportional relationship between PTAT current source and temperature, so as to generate the digital modulation signal. The integration amplifier in the modulation module is omitted, which greatly reduces power consumption. Digital modulation signal is output from the temperature sensor circuit, which improves the detecting accuracy. Meanwhile, the internal temperature of the chip is directly detected; the temperature value is quantized and converted into binary code to be used in digital processing circuit and computer processing, so as to expand the application.

COMPONENT REFERENCE NUMERALS

Figure 1:
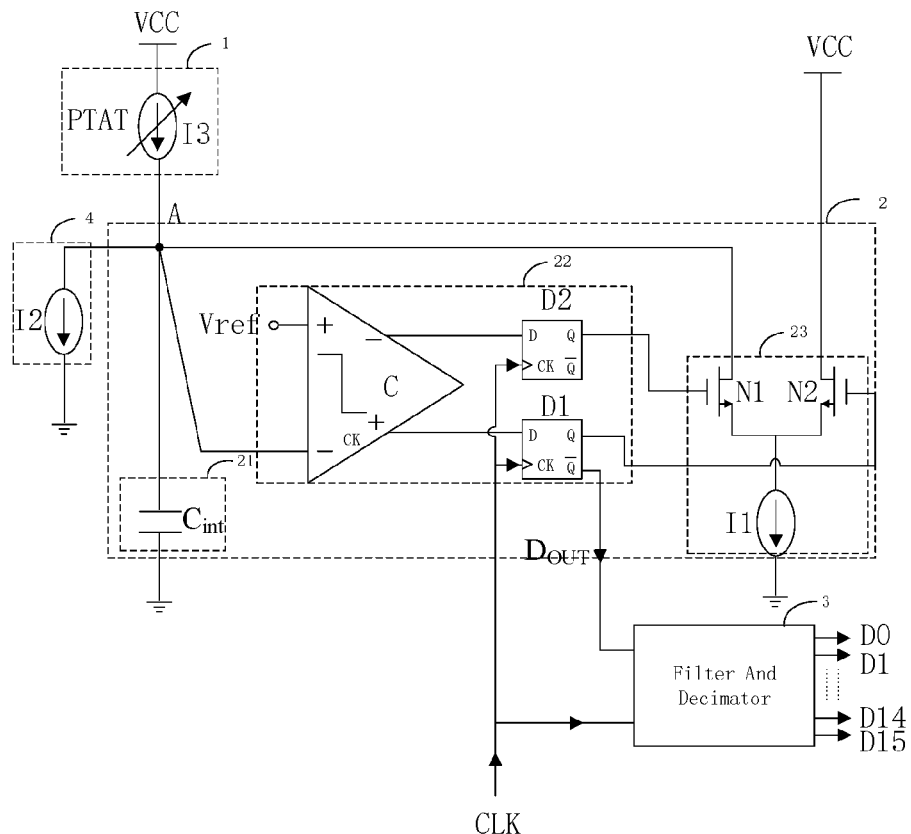
FIG. 1 is a circuit diagram of a digital temperature sensor according to the present disclosure.

1 PTAT current source
2 Sigma-delta modulation module
21 Integrator
22 Analog-to-digital conversion unit
23 Feedback digital-to-analog conversion unit
3 Digital filter
4 Current regulation module

DETAILED DESCRIPTION OF THE PREFERRED EMBODIMENTS

The following describes the embodiments of the present disclosure through specific examples. Those skilled in the art can easily understand other advantages and effects of the present disclosure from the content disclosed in this specification. The present disclosure can also be implemented or applied through different specific implementations, and various details in this specification can also be modified or changed based on different viewpoints and applications without departing from the spirit of the present disclosure. It should be noted that, in the case of no conflict, the following embodiments and features in the embodiments can be combined with each other.

It should be noted that the illustrations provided in the following embodiments only illustrate the basic idea of the present disclosure in a schematic manner, and then only the components related to the present disclosure are shown in the drawings instead of the number, shape and size drawing, the type, quantity, and proportion of each component can be changed at will in actual implementation, and the component layout type may be more complicated.

Referring to FIG. 1, a circuit diagram of a digital temperature sensor according to the present disclosure is illustrated. The digital temperature sensor includes: a proportional-to-absolute-temperature (PTAT) current source 1 for generating a PTAT current, a sigma-delta modulation module 2, and a digital filter 3.

Specifically, a positive terminal of the PTAT current source is connected to a power supply voltage, and a negative terminal of the PTAT current source is connected to an input terminal of the analog-to-digital conversion unit.

The PTAT current source $I_3$ is used as a sensitive element for detecting temperature. The relationship between the current value of the PTAT current source $I_3$ and the temperature is expressed as follows:

$$I_3 = kT \tag{1}$$

In the formula (1), $I_3$ is the current value of the PTAT current source $I_3$, k is a proportional constant, and T is absolute temperature. The operating temperature of semiconductor devices generally ranges from −55° C. to 125° C., which is −215K to 398K when converted to absolute temperature.

Specifically, the design accuracy can be improved by using the PTAT current source and the band gap reference voltage $V_{ref}$. Meanwhile, temperature sensor with high linearity and high precision is achieved.

The sigma-delta modulation module 2 includes an integrator 21, an analog-to-digital conversion unit 22, and a feedback digital-to-analog conversion unit 23. The integrator 21 converts the PTAT current into a temperature voltage. The analog-to-digital conversion unit 22 generates a digital modulation signal after comparing the temperature voltage with the bandgap reference voltage, in the digital modulation signal, the duty ratio is proportional to the temperature. The feedback digital-to-analog conversion unit 23 adjusts the voltage input by the analog-to-digital conversion unit to control the charge/discharge speed of the integrator.

Specifically, the integrator 21 is an integration capacitor $C_{int}$. One terminal of the integration capacitor $C_{int}$ is connected to an output terminal of the PTAT current source and an input terminal of an analog-to-digital conversion unit, and the other terminal of the integration capacitor $C_{int}$ is ground.

The input current is integrated by using the integration capacitor in conjunction with the PTAT current source to obtain a temperature voltage proportional to the temperature. Since the integration capacitor does not require an amplifier, the voltage of the input analog-to-digital conversion unit may be adjusted by adjusting the constant current source. Therefore, both the circuit area and the power are reduced.

The analog-to-digital conversion unit 22 includes a comparator C, a first flip-flop D1 and a second flip-flop D2. A positive input terminal of the comparator C is connected to the band gap reference voltage $V_{ref}$, and a negative input terminal of the comparator C is connected to the output terminal of the integrator 21, the positive output terminal of the comparator C is connected to a first flip-flop D1. The first flip-flop D1 outputs a digital modulation signal D out. A negative output terminal of the first flip-flop D1 is connected to a second flip-flop D2. The output terminal of second flip-flop D2 is connected to the feedback digital-to-analog conversion unit 23. The duty cycle of the obtained digital modulation signal $D_{out}$ is proportional to the detected temperature, thus the temperature may be quantized by the duty cycle of the digital modulation signal $D_{out}$. Since the digital modulation signals $D_{out}$ generated at different temperatures have different cycles, the cycle of the generated digital modulation signal $D_{out}$ changes with the temperature.

The feedback digital-to-analog conversion unit 23 includes a differential pair composed of a first NMOS transistor N1 and a second NMOS transistor N2, and a first constant current source I1. The gate of the first NMOS transistor N1 is connected to the output terminal of the second flip-flop D2, the drain of the first NMOS transistor N1 is connected to the input terminal of the PTAT current source I3. The gate of the second NMOS transistor N2 is connected to the non-Q output terminal of the first flip-flop D1, the drain of the second NMOS transistor N2 is connected to the power supply voltage VCC. The source of the differential pair is connected to the positive terminal of the first constant current source I1, and the negative terminal of the first constant current source I2 is grounded.

The first flip-flop D1 and the second flip-flop D2 are both D-type flip-flops, and the control terminals of D1 and D2 are respectively connected to a clock signal CLK. The comparator C is preferably a dynamic comparator. The differential digital-to-analog conversion unit 23 adjusts the voltage at the negative terminal of the comparator to control the charging/discharging speed of the integration capacitor $C_{int}$.

The digital filter 3 quantizes the digital modulation signal into a digital signal and outputs the digital signal.

Specifically, the digital filter 3 is a digital low-pass filter, and a control terminal of the digital filter 3 is connected to a clock signal CLK. For example, a digital filter is provided at the output stage of the modulator. The characteristics of the digital filter are stable with respect to temperature, therefore the digital filter is not affected by temperature and can always achieve high-precision A/D conversion.

In the present embodiment, the temperature sensor is integrated with the circuit-under-test in one chip, the PTAT current source is proportional to the temperature. On one hand, the digital temperature sensor circuit outputs in pulse width modulation (PWM) mode, which improves the measurement accuracy. On the other hand, the internal temperature of the chip is directly detected, and the temperature value is quantized and converted into binary code, which is convenient for digital processing circuits and computer to process, thereby expanding the application.

The above digital temperature sensor circuit further includes a current adjustment module. The current adjustment module is respectively connected to the PTAT current source and the integrator to adjust the current input into the integrator. The current regulation module is a second constant current source 12, the positive terminal of the current adjustment module is connected to the output terminal of the PTAT current source, and the negative terminal of the current regulation module is grounded. In order to make full use of the quantization range of the quantization circuit, the constant current source 12 which does not change with temperature is introduced. Within the detection temperature range, the following relationship is satisfied:

$$0 < I_3 - I_2 < I_1 \quad (2)$$

In formula (2), $I_1$ is the current value of the constant current source I1, and I2 is the current value of the constant current source I2.

Figure 2:
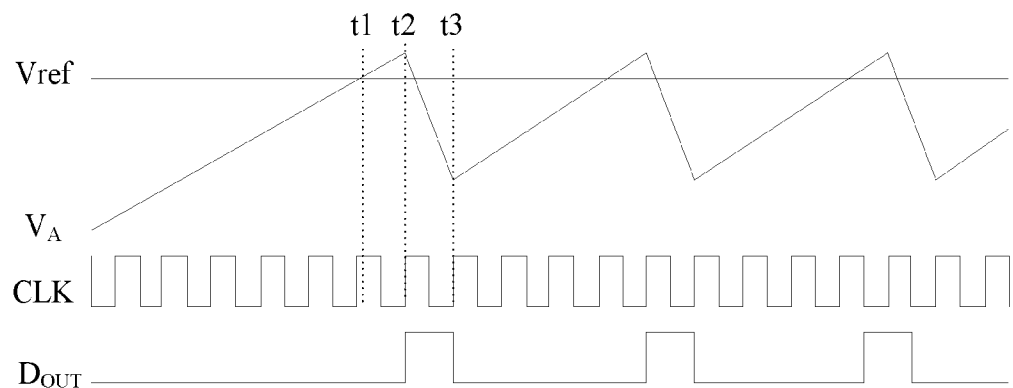
FIG. 2 is a working waveform diagram of a digital temperature sensor circuit diagram for detecting low temperature according to the present disclosure.

Referring to FIG. 2, a working waveform diagram of a digital temperature sensor circuit diagram for measuring low temperature according to the present disclosure is illustrated.

When the temperature is very low, close to the lower limit of the tested temperature, I3-I2 is close to zero, I3-I2 charges the integration capacitor $C_{int}$. The charging is slow due to the small current. If the initial voltage of the integrating capacitor $C_{int}$ is zero, the positive input terminal of the comparator C is connected to a band gap reference voltage $V_{ref}$ that does not change with temperature. Therefore, the positive output terminal of the comparator C outputs at a high level, and the negative output terminal of the comparator C outputs at a low level. When the rising edge of the clock signal arrives, the states of the positive and negative output terminals of comparator C are latched by the D-type flip-flops D1 and D2, respectively. As a result, the non-Q output terminal DOUT of the first flip-flop D1 is at a low level, the Q output of the first flip-flop D1 connected to the gate of the second NMOS transistor N2 is at a high level, and the second NMOS transistor N2 is turned on so that the current of the first constant current source I1 is directed to the power supply voltage VCC.

In the next several clock cycles, the current I3-I2 charges the capacitor $C_{int}$, the capacitor voltage slowly rises, and DOUT remains low level until the clock signal reaches time t1, the capacitor voltage exceeds the band gap reference voltage $V_{ref}$, the positive output terminal of the comparator C converts from a high level to a low level, and the negative output terminal converts from a low level to a high level. At the next rising edge of the clock, at time t2 as shown in FIG. 2, the states of the positive and negative output terminals of the comparator C are latched by the D-type flip-flops D1 and D2, respectively, which results in that the non-Q output terminal of the first flip-flop D1 becomes a high level, while the Q output terminal of the first flip-flop D1 becomes a low level, so that the current of the first constant current source I1 is directed to the node A. The capacitor discharges with a current of I1-(I3-I2). Since the current I3-I2 is close to zero, the current I1-(I3-I2) is approximately equal to I1.

As shown in FIG. 2, compared with the charging speed, the discharging speed is much faster. Within one clock cycle, the capacitor voltage drops below the band gap reference voltage $V_{ref}$, the positive output of the comparator C converts from low level to high level, and the negative output terminal converts from high level to low level. When the next rising edge of the clock arrives, as shown at time t3 of the clock signal, the states of the positive and negative output terminals of the comparator C are latched by the D flip-flops D1 and D2. DOUT converts into a low level, and the current of the first constant current source I1 is directed to the power source VCC. In the next several clock cycles, the current I3-I2 continues to charge the capacitor $C_{int}$, the capacitor voltage slowly rises, and DOUT remains low level. When the circuit is stable, DOUT is a pulse signal with a small duty cycle (the ratio of high-level duration to low-level duration). Referring to FIG. 2, part of the square wave waveform output by DOUT is shown. In fact, for the 16-bit quantization accuracy, $D_{out}$ duty cycle can reach 0.002% (the duty cycle shown in the figure is not accurate for the convenience of representation).

Figure 3:
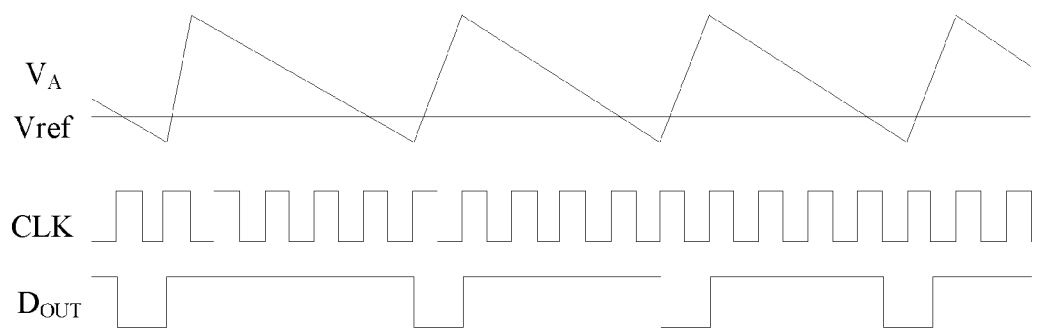
FIG. 3 is a working waveform diagram of a digital temperature sensor circuit diagram for detecting high temperature according to the present disclosure.

Referring to FIG. 3, the working waveform of digital temperature sensor circuit according to the present disclosure detecting high temperature is shown. When the temperature is high and approaches the upper limit of the tested temperature, the current I3-I2 is close to 11. The capacitor $C_{int}$ is charged with a current close to 11 and discharged with a current close to zero. The capacitor voltage will rise quickly and fall slowly. As shown in FIG. 3, $D_{out}$ is a pulse signal with a high duty cycle. For 16-bit quantization accuracy, the $D_{out}$ duty cycle can reach 99.998% (the duty cycle shown in the figure is not accurate for the convenience of representation).

In summary, the duty cycle of $D_{out}$ is proportional to the detected temperature, and the duty cycle of $D_{out}$ can be used for quantizing the temperature. It should be noted that the $D_{out}$ has different cycle for different temperatures. In fact, the integrating capacitor $C_{int}$, the comparator C, the D-type flip-flops D1 and D2, and the differential pair circuit in FIG. 1 constitute a modulator (sigma-delta). The output $D_{out}$ of the modulator is filtered and decimated by the digital filter 17 to obtain low-speed 16-bit binary digital signals D0 to D15. D0~D15 are digital quantized values of the detected temperature signals.

The digital filter 3 is preferably a digital low-pass filter, which has the advantages of high accuracy, high reliability, and easy integration. According to the algorithm, the digital filter 3 can be divided into limiting filtering, median filtering, arithmetic average filtering, moving average filtering, weighting average filtering, low-pass filtering, median average filtering and the like, which are not described in detail herein.

In summary, the temperature sensor is integrated with the circuit-under-test in the same chip, the PTAT current is modulated by sigma-delta module using the proportional relationship between PTAT current source and temperature, so as to generate the digital modulation signal. The integration amplifier in the modulation module is omitted, which greatly reduces power consumption. Digital modulation signal is output from the temperature sensor circuit, which improves the detecting accuracy. Meanwhile, the internal temperature of the chip is directly detected, the temperature value is quantized and converted into binary code to be used in digital processing circuit and computer processing, so as to expand the application. Therefore, the present disclosure effectively overcomes various shortcomings in the prior art and has high industrial value.

The above-mentioned embodiments merely illustrate the principle of the present disclosure and its effects, but are not intended to limit the present disclosure. Anyone familiar with this technology can modify or change the above embodiments without departing from the spirit and scope of the present disclosure. Therefore, all equivalent modifications or changes made by those with ordinary knowledge in the technical field without departing from the spirit and technical ideas disclosed by the present disclosure should still be covered by the claims of the present disclosure.

The invention claimed is:

1. A digital temperature sensor circuit, comprising:
    a proportional to absolute temperature (PTAT) current source, generating a PTAT current proportional to absolute temperature;
    a sigma-delta modulation module, comprising an integrator, an analog-to-digital conversion unit, and a feedback digital-to-analog conversion unit;
        wherein the integrator converts the PTAT current into a temperature voltage;
        the analog-to-digital conversion unit compares the temperature voltage with a band gap reference voltage to generate a digital modulation signal with a duty ratio proportional to the temperature; and
        the feedback digital-to-analog conversion unit adjusts a voltage input by the analog-to-digital conversion unit and controls a charging and discharging speed of the integrator; and
    a digital filter quantizing the digital modulation signal into a digital signal, and outputting the digital signal;
    wherein the integrator is an integration capacitor, one terminal of the integration capacitor is respectively connected to an output terminal of the PTAT current source and an input terminal of the analog-to-digital conversion unit, and the other terminal of the integration capacitor is grounded.

2. The digital temperature sensor circuit according to claim 1, wherein
    a positive terminal of the PTAT current source is connected to a power supply voltage, and
    a negative terminal of the PTAT current source is connected to an input terminal of the analog-to-digital conversion unit.

3. The digital temperature sensor circuit according to claim 1, wherein the digital filter is a digital low pass filter.

4. The digital temperature sensor circuit according to claim 1, further comprising a current adjustment module, the current adjustment module being respectively connected to the PTAT current source and the integrator for adjusting the current input into the integrator.

5. The digital temperature sensor circuit according to claim 4, wherein the current adjustment module is a second constant current source,
    a positive terminal of the current adjustment module is connected to the PTAT current source, and
    a negative terminal of the current adjustment module is grounded.

6. The digital temperature sensor circuit according to claim 1, wherein the analog-to-digital conversion unit comprises a comparator, a first flip-flop and a second flip-flop,
    a positive input terminal of the comparator is connected to a band gap reference voltage,
    a negative input terminal of the comparator is connected to an output terminal of the integrator,
    a positive output terminal of the comparator is connected to the first flip-flop, the first flip-flop outputting the digital modulation signal,
    a negative output terminal of the comparator is connected to the second flip-flop, and
    an output terminal of the second flip-flop is connected to the feedback digital-to-analog conversion unit.

7. The digital temperature sensor circuit according to claim 6, wherein the first flip-flop and the second flip-flop are both D-type flip-flops.

8. The digital temperature sensor circuit according to claim 6, wherein control terminals of the first flip-flop and the second flip-flop and an input terminal of the digital filter are respectively connected to a clock signal.

9. The digital temperature sensor circuit according to claim 6, wherein the feedback digital-to-analog conversion unit comprises a differential pair and a first constant current source,
    the differential pair is composed of a first NMOS transistor and a second NMOS transistor,
    a gate of the first NMOS transistor is connected to an output terminal of the second flip-flop,
    a drain of the first NMOS transistor is connected to an input terminal of the PTAT current source;
    a gate of the second NMOS transistor is connected to a non-Q output terminal of the first flip-flop,
    a drain of the second NMOS transistor is connected to a power supply voltage,
    a source of the differential pair is connected to a positive terminal of the first constant current source, and
    a negative terminal of the first constant current source is grounded.

10. The digital temperature sensor circuit according to claim 9, wherein the first flip-flop and the second flip-flop are both D-type flip-flops.

11. The digital temperature sensor circuit according to claim 9, wherein control terminals of the first flip-flop and the second flip-flop and an input terminal of the digital filter are respectively connected to a clock signal.

* * * * *